(12) United States Patent
Tak et al.

(10) Patent No.: US 7,741,673 B2
(45) Date of Patent: Jun. 22, 2010

(54) FLOATING BODY MEMORY AND METHOD OF FABRICATING THE SAME

(75) Inventors: Nam-Kyun Tak, Bucheon-si (KR); Ki-Whan Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 76 days.

(21) Appl. No.: 11/853,044

(22) Filed: Sep. 11, 2007

(65) Prior Publication Data

US 2008/0142868 A1 Jun. 19, 2008

(30) Foreign Application Priority Data

Dec. 13, 2006 (KR) .......................... 2006-0126831

(51) Int. Cl.
*H01L 29/788* (2006.01)
(52) U.S. Cl. .............................. 257/315; 257/E21.422; 257/E29.3; 438/257
(58) Field of Classification Search ................. 257/315, 257/E21.422, E29.3, 19, 297, E27.084, E21.646, 257/E21.703, E27.112; 438/257, 239, 261
See application file for complete search history.

(56) References Cited

U.S. PATENT DOCUMENTS

| | | | |
|---|---|---|---|
| 5,674,760 | A | 10/1997 | Hong |
| 6,188,105 | B1 | 2/2001 | Kocon et al. |
| 6,495,887 | B1 | 12/2002 | Krishnan et al. |
| 7,061,050 | B2 | 6/2006 | Fazan et al. |
| 7,122,431 | B2 | 10/2006 | Kim et al. |
| 2003/0168677 | A1 | 9/2003 | Hsu |
| 2004/0061148 | A1 | 4/2004 | Hsu |
| 2004/0266081 | A1 | 12/2004 | Oh et al. |
| 2005/0128787 | A1 | 6/2005 | Mouli |
| 2005/0205931 | A1 | 9/2005 | Mouli |
| 2006/0046408 | A1 | 3/2006 | Ohsawa |
| 2006/0049444 | A1 | 3/2006 | Shino |
| 2006/0177980 | A1 | 8/2006 | Willer |
| 2007/0001165 | A1 | 1/2007 | Ranica et al. |
| 2007/0278591 | A1 | 12/2007 | Luo et al. |
| 2008/0099811 | A1* | 5/2008 | Tak et al. ..................... 257/297 |

FOREIGN PATENT DOCUMENTS

| | | |
|---|---|---|
| EP | 1739749 A2 | 1/2007 |
| JP | 2005175090 | 6/2005 |
| JP | 2005-251791 | 9/2005 |
| JP | 2006-080549 | 3/2006 |

(Continued)

*Primary Examiner*—Thomas L Dickey
*Assistant Examiner*—Fazli Erdem
(74) *Attorney, Agent, or Firm*—Volentine & Whitt, PLLC

(57) ABSTRACT

A floating body memory includes a semiconductor substrate having a cell region and a peripheral circuit region. A floating body cell is located in the cell region and a first floating body is located in the peripheral circuit region of the semiconductor substrate. A peripheral gate pattern is positioned on the first floating body. First source and drain regions are positioned at both sides of the peripheral gate pattern. First leakage shielding patterns are positioned between the first floating body and the first source and drain regions, the first source and drain regions contacting the first floating body. The first leakage shielding patterns may be positioned outside outer edges of the peripheral gate pattern.

19 Claims, 14 Drawing Sheets

FOREIGN PATENT DOCUMENTS

| | | |
|---|---|---|
| JP | 2006080280 | 3/2006 |
| JP | 2006-156540 | 6/2006 |
| JP | 2005158952 | 6/2006 |
| KR | 10-1997-0077879 | 12/1997 |
| KR | 1019980015364 | 5/1998 |
| KR | 1019980026126 | 4/1999 |
| KR | 100256254 B1 | 2/2000 |
| KR | 1020020002012 A | 1/2002 |
| KR | 10-2004-0025070 | 3/2004 |
| KR | 1020040077289 A | 9/2004 |
| KR | 1020040086345 | 10/2004 |
| KR | 1020050011376 | 1/2005 |
| KR | 1020050061883 A | 6/2005 |
| KR | 1020060070705 A | 6/2006 |
| KR | 1020060077157 A | 7/2006 |
| KR | 1020060104794 | 10/2006 |

* cited by examiner

FLOATING BODY MEMORY AND METHOD OF FABRICATING THE SAME

CROSS-REFERENCE TO RELATED APPLICATION

A claim of priority is made to Korean Patent Application No. 10-2006-0126831, filed Dec. 13, 2006, the subject matter of which is hereby incorporated by reference.

BACKGROUND OF THE INVENTION

1. Field of the Invention

The present invention relates to a semiconductor device and a method of fabricating the same, and more particularly, to a floating body memory having leakage shield patterns and a method of fabricating the same.

2. Description of the Related Art

In general, a semiconductor memory includes a cell region and a peripheral circuit region. Memory cells are located in the cell region, and driving devices necessary to operate the memory cells, such as transistors, are located in the peripheral circuit region.

Dynamic random access memory (DRAM) cells, which is a type nonvolatile memory device, are widely used as the memory cells. Typically, DRAM cells include one capacitor, one transistor and interconnections. However, the trend toward lightweight, thin, short and small electric appliances has created a demand for more highly integrated DRAM cells. In other words, a great number of DRAM cells must be formed in a restricted space. However, highly integrating the DRAM cells presents a number of difficulties.

For example, the capacitor of a DRAM cell includes an upper electrode, a lower electrode and a capacitor dielectric layer. The upper and lower electrodes have an overlapping region. The capacitor dielectric layer is interposed between the upper electrode and the lower electrode. The capacitance of the capacitor is directly proportional to the size of the overlapping region, and inversely proportional to the thickness of the capacitor dielectric layer. Therefore, the capacitor requires a minimum area based on capacitance requirements.

To address this limitation, single transistor floating body DRAM cells have been researched. A single transistor floating body DRAM cell stores data in a floating body, and does not use the capacitor. Therefore, the single transistor floating body DRAM cell has a more advantageous structure for high integration than the capacitor DRAM cell.

The single transistor floating body DRAM cell includes a buried insulating layer on a semiconductor substrate. An isolation layer, a floating body, and source and drain regions are positioned on the buried insulating layer. A gate dielectric layer and a gate electrode are sequentially stacked on the floating body. The floating body is electrically isolated by the isolation layer, the buried insulating layer, the gate dielectric layer, and the source and drain regions.

The single transistor floating body DRAM cell stores and reads data using a floating body effect. Excess holes produced due to impact ionization are accumulated in the floating body. The excess holes accumulated in the floating body change a threshold voltage (Vt). Accordingly, the amount of current flowing between the source and drain regions depends on the amount of accumulated excess holes.

However, the excess holes accumulated in the floating body are erased in time through the source and drain regions. Delay in erasing the excess holes is favorable for extending the data retention time of the single transistor floating body DRAM cell. Therefore, extending the time before which the excess holes are erased can improve the data retention characteristics of the single transistor floating body DRAM cell.

Meanwhile, the transistor in the peripheral circuit region requires high-speed operation characteristics. When the source and drain regions of the transistor have large junction areas, a junction capacitance of the source and drain regions increases, which leads to a decrease in the operating speed of the transistor. Therefore, reducing the junction capacitance of the source and drain regions can improve the operating speed characteristics of the single transistor floating body DRAM cell.

An example of a floating body memory is disclosed in U.S. Patent Application Publication No. 2006/0046408 to OHSAWA, entitled "Semiconductor Integrated Device." According to OHSAWA, an NMOSFET, a PMOSFET and a floating body cell (FBC) are provided on a silicon-on-insulator (SOI) substrate.

SUMMARY OF THE INVENTION

An aspect of the present invention provides a floating body memory, having a semiconductor substrate including a cell region and a peripheral circuit region. A floating body cell is located in the cell region of the semiconductor substrate, and a first floating body is located in the peripheral circuit region of the semiconductor substrate. A peripheral gate pattern is positioned on the first floating body. First source and drain regions are positioned at both sides of the peripheral gate pattern. First leakage shielding patterns are positioned between the first floating body and the first source and drain regions, the first source and drain regions contacting the first floating body.

The first leakage shielding patterns may be positioned outside the peripheral gate pattern. Also, the first leakage shielding patterns may contact bottom surfaces of the first source and drain regions. The first floating body may be interposed between the first source and drain regions, and extend under the first leakage shielding patterns. The first floating body may extend beyond the first source and drain regions and the first leakage shielding patterns. The first leakage shielding patterns may include at least one of a silicon oxide layer, a silicon nitride layer and a silicon oxynitride layer.

The floating body memory may further include a first isolation layer defining the first floating body, and a second isolation layer on the extended first floating body. A back bias line may be positioned on the semiconductor substrate, and a back bias plug may be positioned between the extended first floating body and the back bias line, contacting the extended first floating body and the back bias line.

The floating body cell, located in the cell region of the semiconductor substrate, includes a second floating body located in the cell region of the semiconductor substrate, the second floating body having an excess carrier storage region. A cell gate pattern may be positioned on the second floating body. Second source and drain regions may be positioned at both sides of the cell gate pattern. Second leakage shielding patterns may be positioned between the second floating body and the second source and drain regions, the second source and drain regions contacting the second floating body. The second leakage shielding patterns may contact bottom surfaces of the second source and drain regions. The second floating body may be interposed between the second source and drain regions, and extend under the second leakage shielding patterns. A width of the excess carrier storage region is greater than a width of the cell gate pattern.

The floating body memory may also include a buried insulating layer positioned under the first and second floating bodies and covering the semiconductor substrate. A back gate line may be positioned on an insulting layer, and a back gate plug may pass through at least the buried insulating layer and contact the back gate line and the semiconductor substrate in the cell region.

Another aspect of the present invention provides a method of fabricating a floating body memory. The method includes forming a first isolation layer defining first and second floating bodies on a semiconductor substrate, the first floating body being formed in a peripheral circuit region of the semiconductor substrate and the second floating body being formed in a cell region of the semiconductor substrate. A recessed region is formed at an edge of the first floating body, and a second isolation layer is formed, filling the recessed region. A peripheral gate pattern is formed on the first floating body, and a cell gate pattern is formed on the second floating body. First leakage shielding patterns are formed in the first floating body at both sides of the peripheral gate pattern, and second leakage shielding patterns are formed in the second floating body at both sides of the cell gate pattern.

Forming the first leakage shielding pattern and the second leakage shielding pattern may include injecting germanium (Ge) ions into the first floating body and the second floating body using the peripheral gate pattern and the cell gate pattern as masks, respectively, and forming first and second temporary patterns. The first and second temporary patterns are etched to form first and second gaps. The first and second gaps are filled with an insulating layer. First and second source and drain regions may be formed in the first and second floating bodies over the first and second gaps, respectively.

The method may further include forming first and second source and drain regions over the first and second leakage shielding patterns, respectively. The first floating body may extend beyond the first leakage shielding patterns. Each of the first and second leakage shielding patterns may be formed from at least one of a silicon oxide layer, a silicon nitride layer and a silicon oxynitride layer.

The method may further include forming a gate dielectric layer on the first floating body and the second floating body before forming the peripheral gate pattern on the first floating body and the cell gate pattern on the second floating body. Also, forming each of the peripheral gate pattern and the cell gate pattern may include sequentially stacking a gate electrode, a pad oxide layer and a mask nitride layer.

An interlayer insulating layer may be formed to cover the peripheral gate pattern, the cell gate pattern, the first floating body and the second floating body. A back bias plug may pass through at least the interlayer insulating layer and the second isolation layer to contact the first floating body, and a back gate plug may pass through at least the interlayer insulating layer and the first isolation layer to contact the semiconductor substrate in the cell region. A back bias line may contact the back bias plug and a back gate line may contact the back gate plug on the interlayer insulating layer.

BRIEF DESCRIPTION OF THE DRAWINGS

The drawings are not necessarily to scale, emphasis instead being placed upon illustrating the principles of the embodiments of the present invention. The embodiments of the present invention will be described with reference to the attached drawings, in which.

DETAILED DESCRIPTION OF THE EMBODIMENTS

Figure 1:
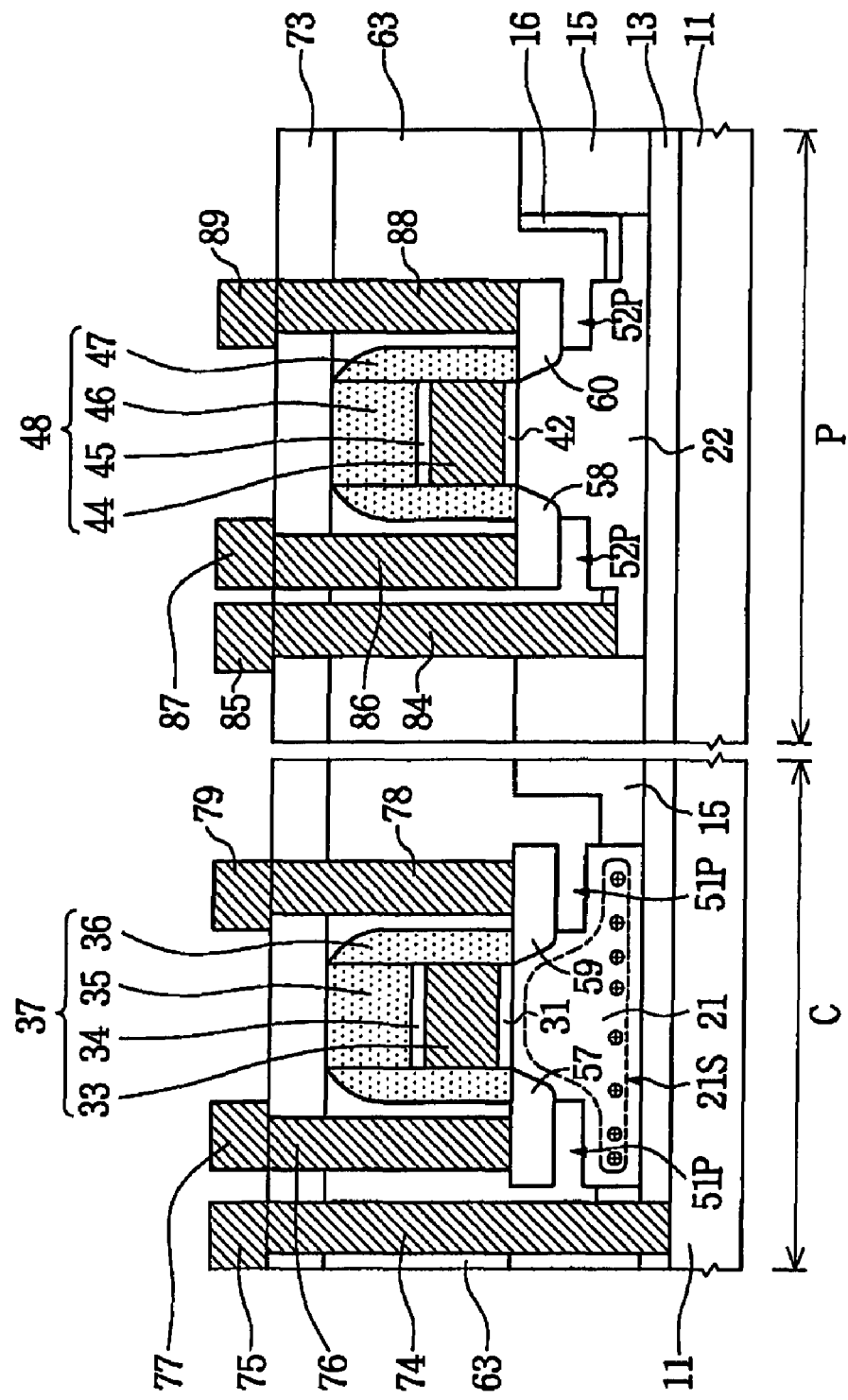
FIG. 1 is a cross-sectional view of a floating body memory, according to a first exemplary embodiment of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. In the drawings, the thicknesses of layers and regions are exaggerated for clarity. In addition, when a layer is described to be formed on another layer or on a substrate, it is intended to mean that the layer may be formed directly on the other layer or on the substrate, or another layer may be interposed between the layer and the other layer and/or substrate. Throughout the drawings and written description, like reference numerals will be used to refer to like or similar elements.

FIG. 1 is a cross-sectional view of a floating body memory according to a first exemplary embodiment of the present invention.

Referring to FIG. 1, the floating body memory includes a semiconductor substrate 11 having a cell region C and a peripheral circuit region P. The semiconductor substrate 11 may be a silicon wafer, for example. A buried insulating layer 13 covering the semiconductor substrate 11 may be included. The buried insulating layer 13 may be a silicon oxide layer, a silicon nitride layer, a silicon oxynitride layer, or a combination thereof.

First and second floating bodies 22 and 21 may be positioned separate from each other on the buried insulating layer 13. The first and second floating bodies 22 and 21 may be a semiconductor layer formed from single crystal silicon, for example. The first and second floating bodies 22 and 21 may be defined by a first isolation layer 15 positioned on the buried insulating layer 13. The first floating body 22 may be located in the peripheral circuit region P. The first floating body 22 may contain n-type or p-type impurity ions. The second floating body 21 may be located in the cell region C. The second floating body 21 may contain n-type or p-type impurity ions.

A bottom of the first isolation layer 15 may be in contact with the buried insulating layer 13. Sidewalls of the first and second floating bodies 22 and 21 may be in contact with the first isolation layer 15. The first isolation layer 15 may be an insulating layer, such as a silicon oxide layer, a silicon nitride layer, a silicon oxynitride layer, or a combination thereof.

Recessed regions may be defined at both edges of the first floating body 22. A second isolation layer 16 may be provided on the recessed regions. In this case, the first floating body 22 extends under the second isolation layer 16. A sidewall of the second isolation layer 16 may be in contact with the first isolation layer 15. The second isolation layer 16 may be an insulating layer such as a silicon oxide layer, a silicon nitride layer, a silicon oxynitride layer, or a combination thereof.

A peripheral gate pattern 48 is positioned on the first floating body 22. The peripheral gate pattern 48 may include a first gate electrode 44 and a first mask nitride layer 46, which are sequentially stacked. A first pad oxide layer 45 may be interposed between the first gate electrode 44 and the first mask nitride layer 46. Further, the peripheral gate pattern 48 may include first spacers 47 which cover sidewalls of at least the first gate electrode 44.

A peripheral gate dielectric layer 42 may be interposed between the first gate electrode 44 and the first floating body 22. In this case, the first spacers 47 may cover sidewalls of the peripheral gate dielectric layer 42, the first gate electrode 44, the first pad oxide layer 45, and the first mask nitride layer 46.

The peripheral gate dielectric layer 42 may be, for example, a silicon oxide layer, a silicon nitride layer, a silicon oxynitride layer, a high-k dielectric layer, or a combination thereof. The first gate electrode 44 may be formed from a conductive layer, for example, a poly silicon layer, a metal layer, a metal silicide layer, or a combination thereof. The first pad oxide layer 45 may be formed from a silicon oxide layer, for example. The first mask nitride layer 46 may be formed from a silicon nitride layer or a silicon oxynitride layer, for example. The first spacers 47 may be formed, for example, from a silicon oxide layer, a silicon nitride layer, a silicon oxynitride layer, or a combination thereof.

A cell gate pattern 37 is positioned on the second floating body 21. The cell gate pattern 37 may include a second gate electrode 33 and a second mask nitride layer 35, which are sequentially stacked. A second pad oxide layer 34 may be interposed between the second gate electrode 33 and the second mask nitride layer 35. Further, the cell gate pattern 37 may include second spacers 36 which cover at least the sidewalls of the second gate electrode 33.

A cell gate dielectric layer 31 may be interposed between the second gate electrode 33 and the second floating body 21. In this case, the second spacers 36 may cover sidewalls of the cell gate dielectric layer 31, the second gate electrode 33, the second pad oxide layer 34, and the second mask nitride layer 35.

The cell gate dielectric layer 31 may be, for example, a silicon oxide layer, a silicon nitride layer, a silicon oxynitride layer, a high-k dielectric layer, or a combination thereof. The second gate electrode 33 may be formed from a conductive layer, for example, a poly silicon layer, a metal layer, a metal silicide layer, or a combination thereof. The second pad oxide layer 34 may be formed from a silicon oxide layer, for example. The second mask nitride layer 35 may be formed from a silicon nitride layer or a silicon oxynitride layer, for example. The second spacers 36 may be formed, for example, from a silicon oxide layer, a silicon nitride layer, a silicon oxynitride layer, or a combination thereof.

First source and drain regions 58 and 60 are positioned at both sides of the peripheral gate pattern 48 in the peripheral circuit region P. The first source and drain regions 58 and 60 may be high-concentration impurity regions. In this case, the first source and drain regions 58 and 60 may contain impurity ions having a different conductivity type from the first floating body 22. For example, while the first floating body 22 contains p-type impurity ions, the first source and drain regions 58 and 60 may contain n-type impurity ions.

The first source and drain regions 58 and 60 may be arranged outside outer edges of the first gate electrode 44. The first source and drain regions 58 and 60 may be in contact with the first floating body 22. First leakage shielding patterns 52P may be positioned under the first source and drain regions 58 and 60. The first leakage shielding patterns 52P may be arranged outside outer edges of the peripheral gate pattern 48, and in contact with respective bottoms of the first source and drain regions 58 and 60. In this cases the first floating body 22 may extend under the first leakage shielding patterns 52P.

The first gate electrode 44, the first source and drain regions 58 and 60, and the first floating body 22 may constitute a peripheral transistor.

As described above, the first floating body 22 may be interposed between the first source and drain regions 58 and 60, and extend under the first leakage shielding patterns 52P. Further, the first floating body 22 may extend beyond the first leakage shielding pattern 52P.

Second source and drain regions 57 and 59 are positioned at both sides of the cell gate pattern 37 in the cell region C. The second source and drain regions 57 and 59 may be high-concentration impurity regions. In this case, the second source and drain regions 57 and 59 may contain impurity ions having a different conductivity type from the second floating body 21. For example, while the second floating body 21 contains p-type impurity ions, the second source and drain regions 57 and 59 may contain n-type impurity ions.

The second source and drain regions 57 and 59 may be arranged outside outer edges of the second gate electrode 33. The second source and drain regions 57 and 59 may be in contact with the second floating body 21. Second leakage shielding patterns 51P may be positioned under the second source and drain regions 57 and 59. The second leakage shielding patterns 51P may be arranged outside outer edges of the cell gate pattern 37, and in contact with respective bottoms of the second source and drain regions 57 and 59. In this case, the second floating body 21 may extend under the second leakage shielding patterns 51P.

The second gate electrode 33, the second source and drain regions 57 and 59, and the second floating body 21 may constitute a floating body memory cell.

As described above, the second floating body 21 may be interposed between the second source and drain regions 57 and 59, and extend under the second leakage shielding patterns 51P. In this case, the second floating body 21 may be wider than the cell gate pattern 37. An excess carrier storage region 21S may be formed in the second floating body 21, and thus may also extend under the second leakage shielding patterns 51P. The excess carrier storage region 21C may also be wider than the cell gate pattern 37.

A lower insulating layer 63 may cover the source and drain regions 57, 58, 59 and 60, the gate patterns 37 and 48, the floating bodies 21 and 22, and the isolation layers 15 and 16. Top surfaces of the mask nitride layers 35 and 46 and the lower insulating layer 63 may be exposed on substantially the same plane. The mask nitride layers 35 and 46 and the lower insulating layer 63 may be covered with an upper insulating layer 73.

The lower insulating layer 63 and the upper insulating layer 73 may constitute an interlayer insulating layer. The lower insulating layer 63 and the upper insulating layer 73 may be formed, for example, from a silicon oxide layer, a silicon nitride layer, a silicon oxynitride layer, or a combination thereof. The lower insulating layer 63 may extend into the second isolation layer 16 to be in contact with the first leakage shielding patterns 52P. Also, the lower insulating layer 63 may extend into the first isolation layer 15 to be in contact with the second leakage shielding patterns 51P. The leakage shielding patterns 51P and 52P may be formed, for example, from a silicon oxide layer, a silicon nitride layer, a silicon oxynitride layer, or a combination thereof. The lower insulating layer 63 may be the same material layer as the leakage shielding patterns 51P and 52P.

Source and drain lines 77, 79, 87 and 89 may be positioned on the upper insulating layer 73. Source and drain plugs 76, 78, 86 and 88 passing through the interlayer insulating layer may be positioned between the source and drain lines 77, 79, 87 and 89 and the source and drain regions 57, 59, 58 and 60, respectively. The source and drain lines 77, 79, 87 and 89 and the source and drain plugs 76, 78, 86 and 88 may be formed, for example, from a conductive layer such as a poly silicon layer, a metal layer, a metal suicide layer, or a combination thereof.

Further, a back bias line 85 and a back gate line 75 may be positioned on the upper insulating layer 73. A back bias plug 84 may be positioned between the back bias line 85 and the first floating body 22. The back bias plug 84 may be in contact with the back bias line 85 and the first floating body 22. The back bias plug 84 may pass through the interlayer insulating layer and the second isolation layer 16.

A back gate plug 74 may be positioned between the semiconductor substrate 11 and the back gate line 75 in the cell region C. The back gate plug 74 may be in contact with the back gate line 75 and the semiconductor substrate 11. The back gate plug 74 may pass through the interlayer insulating layer, the first isolation layer 15, and the buried insulating layer 13.

The back bias plug 84, the back bias line 85, the back gate plug 74, and the back gate line 75 may be formed, for example, from a conductive layer such as a poly silicon layer, a metal layer, a metal silicide layer, or a combination thereof. The first floating body 22 may be electrically connected to the back bias line 85 through the back bias plug 84. The semiconductor substrate 11 in the cell region C may be electrically connected to the back gate line 75 through the back gate plug 74.

The floating body memory according to the first exemplary embodiment of the present invention may include the first and second leakage shielding patterns 52P and 51P. A contact surface between the first source and drain regions 58 and 60 and the first floating body 22 may be minimized by the first leakage shielding patterns 52P. That is, a junction capacitance between the first source and drain regions 58 and 60 and the first floating body 22 may be significantly reduced by the first leakage shielding patterns 52P. Accordingly, the peripheral transistor may have high-speed operation characteristics.

Further, the back bias line 85 may form a body contact, such as grounding, with one of the first source and drain regions 58 and 60, or application of back bias voltage.

During a write operation, excess holes generated due to impact ionization are accumulated in the excess carrier storage region 21S. However, a contact surface between the second source and drain regions 57 and 59 and the second floating body 21 may be minimized by the second leakage shielding patterns 51P. That is, the second leakage shielding patterns 51P may function to block a leakage path of the excess holes. Accordingly, the second leakage shielding patterns 51P extend the time that the excess holes are retained in the excess carrier storage region 21S.

Furthermore, a back gate voltage may be applied to the back gate line 75. In this case, the semiconductor substrate 11 may function as a back gate. The application of the back gate voltage may further extend the retention time of the excess holes.

Figure 2:
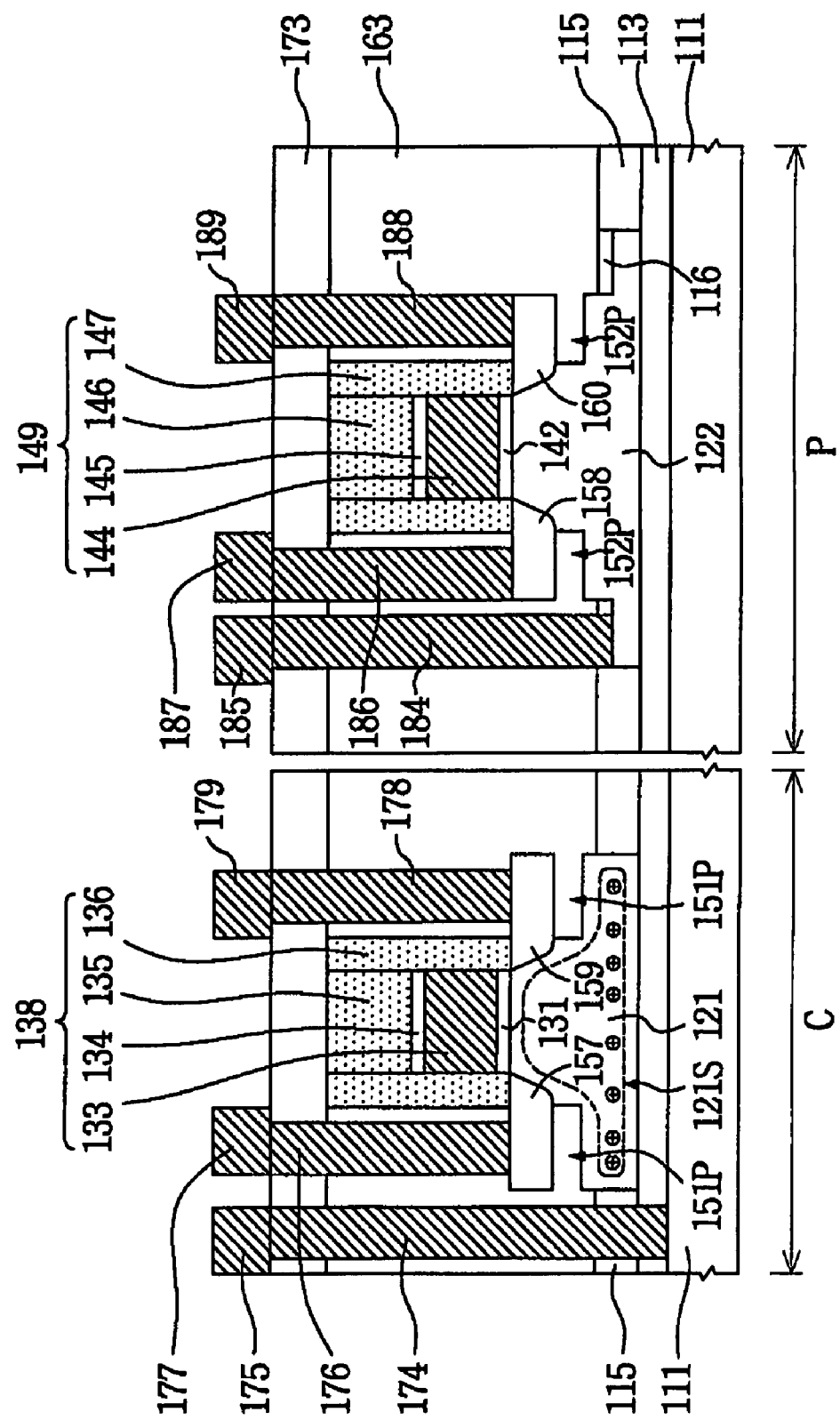
FIG. 2 is a cross-sectional view of a floating body memory, according to a second exemplary embodiment of the present invention.

FIG. 2 is a cross-sectional view of a floating body memory according to a second exemplary embodiment of the present invention.

Referring to FIG. 2, the floating body memory according to the second exemplary embodiment of the present invention includes a semiconductor substrate 111 having a cell region C and a peripheral circuit region P. A buried insulating layer 113 may be formed to cover the semiconductor substrate 111. First and second floating bodies 122 and 121 may be positioned separated from each other on the buried insulating layer 113. The first and second floating bodies 122 and 121 may be defined by a first isolation layer 115, which is positioned on the buried insulating layer 113.

Recessed regions may be defined at both edges of the first floating body 122. A second isolation layer 116 may be on the recessed regions. In this case, the first floating body 122 may extend under the second isolation layer 116. A sidewall of the second isolation layer 116 may be in contact with the first isolation layer 115.

A peripheral gate pattern 149 is positioned on the first floating body 122. The peripheral gate pattern 149 may include a first gate electrode 144 and a first mask nitride layer 146, which are sequentially stacked. A first pad oxide layer 145 may be interposed between the first gate electrode 144 and the first mask nitride layer 146. Further, the peripheral gate pattern 149 may include first spacers 147 which cover at least sidewalls of the first gate electrode 144.

A peripheral gate dielectric layer 142 may be interposed between the first gate electrode 144 and the first floating body 122. In this case, the first spacers 147 may cover sidewalls of the peripheral gate dielectric layer 142, the first gate electrode 144, the first pad oxide layer 145, and the first mask nitride layer 146.

A cell gate pattern 138 is positioned on the second floating body 121. The cell gate pattern 138 may include a second gate electrode 133 and a second mask nitride layer 135, which are sequentially stacked. A second pad oxide layer 134 may be interposed between the second gate electrode 133 and the second mask nitride layer 135. Further, the cell gate pattern 138 may include second spacers 136, which cover at least sidewalls of the second gate electrode 133.

A cell gate dielectric layer 131 may be interposed between the second gate electrode 133 and the second floating body 121. In this case, the second spacers 136 may cover sidewalls of the cell gate dielectric layer 131, the second gate electrode 133, the second pad oxide layer 134, and the second mask nitride layer 135.

First source and drain regions 158 and 160 are positioned at both sides of the peripheral gate pattern 149 in the peripheral circuit region P. The first source and drain regions 158 and 160 may be arranged outside outer edges of the first gate electrode 144. The first source and drain regions 158 and 160 may be in contact with the first floating body 122. First leakage shielding patterns 152P may be positioned under the first source and drain regions 158 and 160. The first leakage shielding patterns 152P may be in contact with respective bottoms of the first source and drain regions 158 and 160. The first floating body 122 may extend under the first leakage shielding patterns 152P.

The first gate electrode 144, the first source and drain regions 158 and 1601 and the first floating body 122 may constitute a peripheral transistor.

As described above, the first floating body 122 may be interposed between the first source and drain regions 158 and 160, and extend under the first leakage shielding patterns 152P. Further, the first floating body 122 may extend beyond the first leakage shielding patterns 152P.

Second source and drain regions 157 and 159 are positioned at both sides of the cell gate pattern 138 in the cell region C. The second source and drain regions 157 and 159 may be arranged outside outer edges of the second gate electrode 133. The second source and drain regions 157 and 159 may be in contact with the second floating body 121. Second leakage shielding patterns 151P may be positioned under the second source and drain regions 157 and 159. The second leakage shielding patterns 151P may be in contact with respective bottoms of the second source and drain regions 157 and 159. The second floating body 121 may extend under the second leakage shielding patterns 151P.

The second gate electrode 133, the second source and drain regions 157 and 159, and the second floating body 121 may constitute a floating body memory cell.

As described above, the second floating body 121 may interposed between the second source and drain regions 157 and 159, and extend under the second leakage shielding patterns 151P. In this case, the second floating body 121 may have a larger width than the cell gate pattern 138. An excess carrier storage region 121S may be formed in the second floating body 121. Therefore, the excess carrier storage region 121S may also extend under the second leakage shielding patterns 151P. That is, the excess carrier storage region 121S may also have a larger width than the cell gate pattern 138.

A lower insulating layer 163 may cover the source and drain regions 157, 158, 159 and 160, the gate patterns 138 and 149, the floating bodies 121 and 122, and the isolation layers 115 and 116. The mask nitride layers 135 and 146 and the lower insulating layer 163 may be covered by an upper insulating layer 173.

The lower insulating layer 163 and the upper insulating layer 173 may constitute an interlayer insulating layer. The lower insulating layer 163 may extend into the second isolation layer 116 to be in contact with the first leakage shielding patterns 152P. Also, the lower insulating layer 163 may extend into the first isolation layer 115 to be in contact with the second leakage shielding patterns 151P. The leakage shielding patterns 151P and 152P may be formed, for example, from a silicon oxide layer, a silicon nitride layer, a silicon oxynitride layer, or a combination thereof. The lower insulating layer 163 may be the same material layer as the leakage shielding patterns 151P and 152P.

Source and drain lines 177, 179, 187 and 189 may be positioned on the upper insulating layer 173. Source and drain plugs 176, 178, 186 and 188 passing through the interlayer insulating layer may be positioned between the source and drain lines 177, 179, 187 and 189 and the source and drain regions 157, 159, 158 and 160, respectively.

Further, a back bias line 185 and a back gate line 175 may be positioned on the upper insulating layer 173. A back bias plug 184 may be positioned between the back bias line 185 and the first floating body 122. The back bias plug 184 may be in contact with the back bias line 185 and the first floating body 122. The back bias plug 184 may be positioned to pass through the interlayer insulating layer and the second isolation layer 116.

A back gate plug 174 may be positioned between the back gate line 175 and the semiconductor substrate 111. The back gate plug 174 may be in contact with the back gate line 175 and the semiconductor substrate 111. The back gate plug 174 may be positioned to pass through the interlayer insulating layer, the first isolation layer 115, and the buried insulating layer 113.

In the depicted embodiment, the first isolation layer 115 and the second isolation layer 116 may be positioned at a lower level than the source and drain regions 157, 158, 159 and 160. Also, the first isolation layer 115 and the second isolation layer 116 may be positioned at a lower level than top surfaces of the leakage shielding patterns 151P and 152P. Also, the first and second isolation layers 115 and 116 may be covered with the lower insulating layer 163.

FIGS. 3 to 9 are cross-sectional views illustrating a method of fabricating a floating body memory according to a first exemplary embodiment of the present invention.

Figure 3:
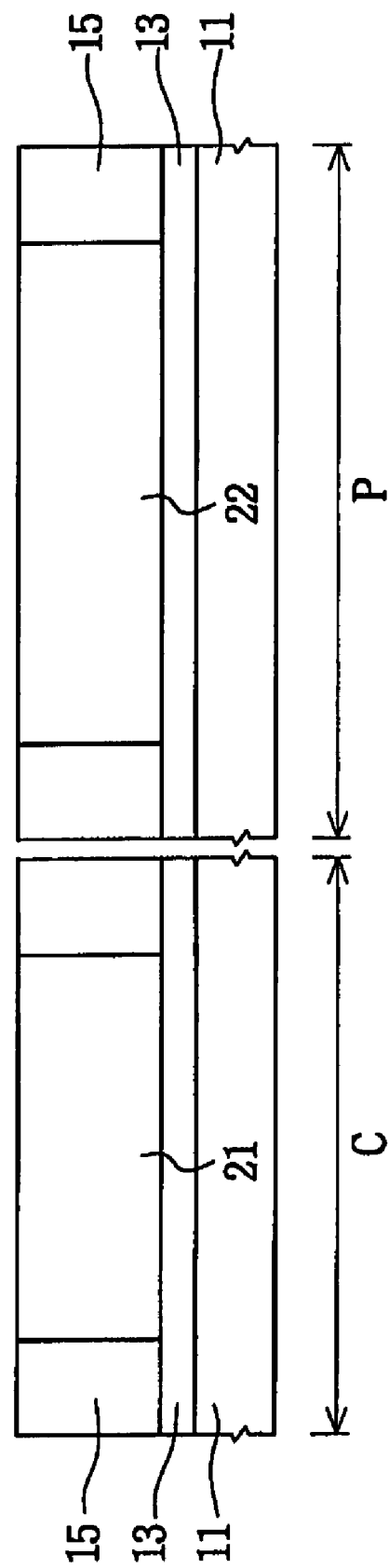
FIGS. 3 to 9 are cross-sectional views illustrating a method of fabricating a floating body memory, according to a first exemplary embodiment of the present invention.

Referring to FIG. 3, a semiconductor substrate 11 having a cell region C and a peripheral circuit region P are prepared. The semiconductor substrate 11 may be a silicon wafer, for example. A buried insulating layer 13 may be formed to cover the semiconductor substrate 11. The buried insulating layer 13 may be formed, for example, from a silicon oxide layer, a silicon nitride layer, a silicon oxynitride layer, or a combination thereof.

Floating bodies 22 and 21 and a first isolation layer 15 may be formed on the buried insulating layer 13. The floating bodies 22 and 21 may be formed, for example, from a semiconductor layer, such as a single crystal silicon layer. The first isolation layer 15 may be formed, for example, by a trench isolation technique. The first isolation layer 15 may be formed from an insulating layer, such as a silicon oxide layer, a silicon nitride layer, a silicon oxynitride layer, or a combination thereof. Top surfaces of the first isolation layer 15 may be planarized to be exposed at substantially the same level as top surfaces of the floating bodies 22 and 21.

As a result, the first floating body 22 is formed in the peripheral circuit region P, and the second floating body 21 is formed in the cell region C. The first and second floating bodies 22 and 21, spaced apart from each other on the buried insulating layer 13, may be defined by the first isolation layer 15. The first isolation layer 15 may be formed in contact with the buried insulating layer 13. Sidewalls of the first and second floating bodies 22 and 21 may be formed in contact with the first isolation layer 15.

N-type or p-type impurity ions may be injected into the first floating body 22. Also, the impurity ions may exhibit a graded ion profile in the first floating body 22. For example, p-type impurity ions may be injected into the first floating body 22. In this case, the p-type impurity ions may have a concentration which decreases toward a top surface of the first floating body 22.

Likewise, n-type or p-type impurity ions may also be injected into the second floating body 21. The impurity ions may also exhibit a graded ion profile in the second floating body 21. For example, p-type impurity ions may be injected into the second floating body 21. In this case, the p-type impurity ions may have a concentration which decreases toward a top surface of the second floating body 21.

Alternatively, the buried insulating layer 13, the floating bodies 22 and 21, and the first isolation layer 15 may be formed from a silicon-on-insulator (SOI) wafer.

Figure 4:
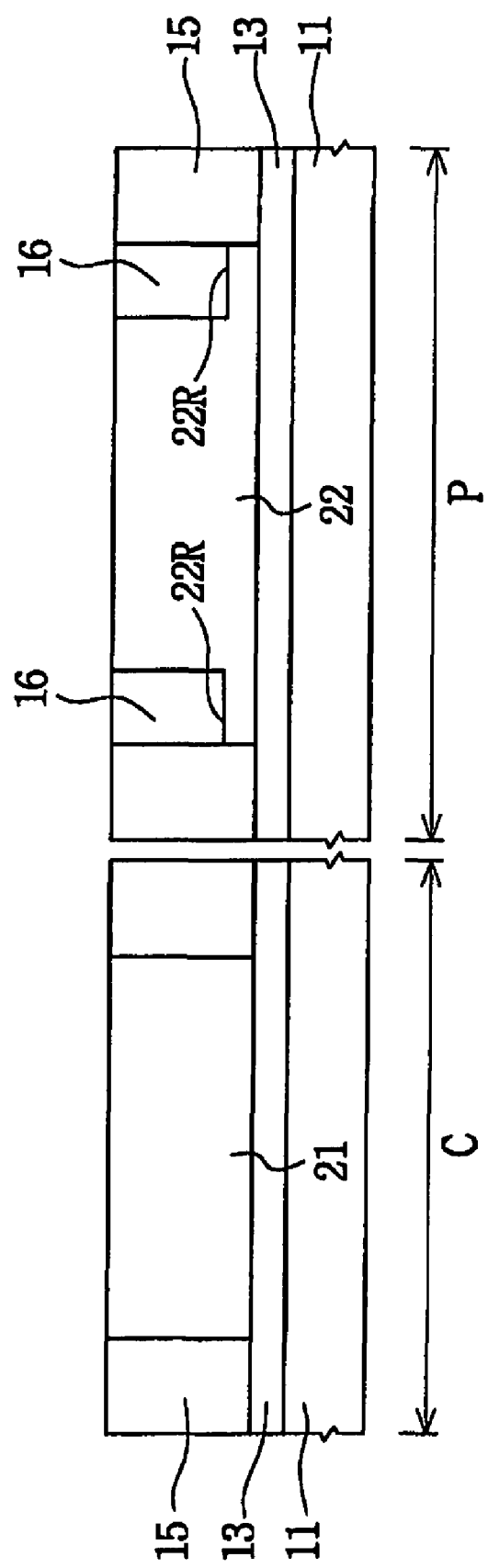

Referring to FIG. 4, recessed regions 22R are formed at both edges of the first floating body 22. The recessed regions 22R may be formed by partially etching both edges of the first floating body 22 using a patterning process, for example. In this case, at least a portion of the first floating body 22 may remain under the recessed regions 22R. Sidewalls of the first isolation layer 15 may be partially exposed by the recessed regions 22R.

An insulating layer filling the recessed regions 22R and covering the semiconductor substrate 11 may be formed. The insulating layer is planarized, and thus forming second isolation layer 16 in the recessed regions 22R. The second isolation layer 16 may be formed, for example, from a silicon oxide layer, a silicon nitride layer, a silicon oxynitride layer, or a combination thereof.

Consequently, top surfaces of the second isolation layer 16, the first isolation layer 15, and the floating bodies 22 and 21 may be exposed in substantially the same plane. At least a portion of the first floating body 22 may remain under the second isolation layer 16. The sidewalls of the second isolation layer 16 may be in contact with the first isolation layer 15.

Figure 5:
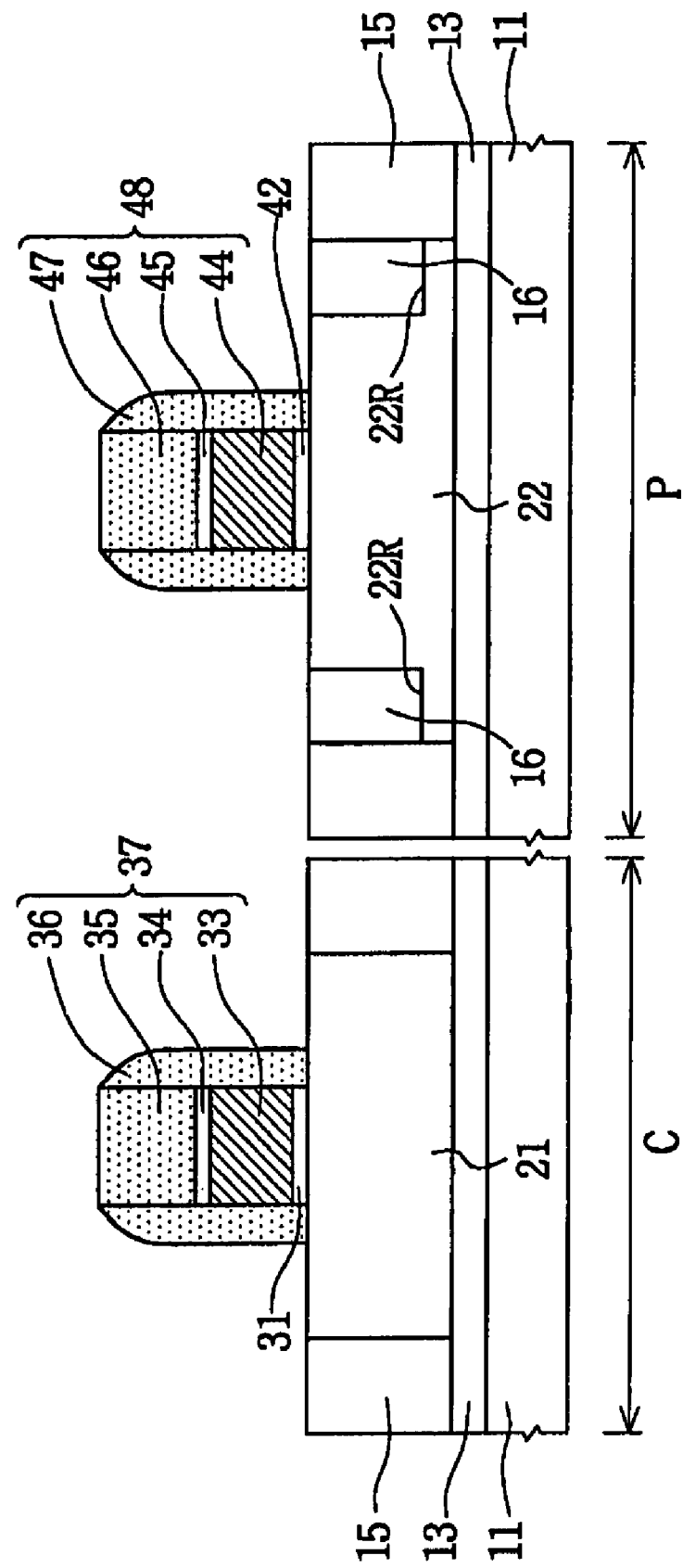

Referring to FIG. 5, a peripheral gate dielectric layer 42 may be formed on the first floating body 22. Also, a cell gate dielectric layer 31 may be formed on the second floating body 21. The peripheral gate dielectric layer 42 and the cell gate dielectric layer 31 may be formed by different processes. The peripheral gate dielectric layer 42 and the cell gate dielectric layer 31 may be formed, for example, from a silicon oxide layer, a silicon nitride layer, a silicon oxynitride layer, a high-k dielectric layer, or a combination thereof. The peripheral gate dielectric layer 42 and the cell gate dielectric layer 31 may be formed to cover at least a portion of the first floating body 22 and the second floating body 21.

A first gate electrode 44, a first pad oxide layer 45, and a first mask nitride layer 46 may be sequentially stacked on the peripheral gate dielectric layer 42 by deposition and patterning processes. In an embodiment, the first pad oxide layer 45 may be omitted. During the patterning process for forming the first gate electrode 44, a portion of the peripheral gate dielectric layer 42 extending beyond both sides of the first gate electrode 44 may be removed. In this case, a portion of the peripheral gate dielectric layer 42 remains under the first gate electrode 44.

First spacers 47 covering sidewalls of the peripheral gate dielectric layer 42, the first gate electrode 44, the first pad oxide layer 45, and the first mask nitride layer 46 may be formed. The first gate electrode 44, the first pad oxide layer 45, the first mask nitride layer 46, and the first spacers 47 may constitute a peripheral gate pattern 48. As a result, portions of the top surface of the first floating body 22 extending beyond both sides of the peripheral gate pattern 48 may be exposed.

The first gate electrode 44 may be formed from a conductive layer, such as a polysilicon layer, a metal layer, a metal silicide layer, or a combination thereof. The first pad oxide layer 45 may be formed from a silicon oxide layer, for example. The first mask nitride layer 46 may be formed from a silicon nitride layer or a silicon oxynitride layer, for example. The first spacers 47 may be formed, for example, from a silicon oxide layer, a silicon nitride layer, a silicon oxynitride layer, or a combination thereof.

A second gate electrode 33, a second pad oxide layer 34, and a second mask nitride layer 35 may be sequentially stacked on the cell gate dielectric layer 31 by deposition and patterning processes. In an embodiment, the second pad oxide layer 34 may be omitted. During the patterning process for forming the second gate electrode 33, a portion of the cell gate dielectric layer 31 extending beyond both sides of the second gate electrode 33, may be removed. In this case, a portion of the cell gate dielectric layer 31 remains under the second gate electrode 33.

Second spacers 36 covering sidewalls of the cell gate dielectric layer 31, the second gate electrode 33, the second pad oxide layer 34, and the second mask nitride layer 35 may be formed. The second gate electrode 33, the second pad oxide layer 34, the second mask nitride layer 35, and the second spacers 36 may constitute a cell gate pattern 37. As a result, portions of the top surface of the second floating body 21 extending beyond both sides of the cell gate pattern 37 may be exposed.

The second gate electrode 33 may be formed from a conductive layer, such as a polysilicon layer, a metal layer, a metal silicide layer, or a combination thereof. The second pad oxide layer 34 may be formed from a silicon oxide layer, for example. The second mask nitride layer 35 may be formed from a silicon nitride layer or silicon oxynitride layer, for example. The second spacers 36 may be formed, for example, from a silicon oxide layers, a silicon nitride layer, a silicon oxynitride layer, or a combination thereof.

The first and second gate electrodes 44 and 33 may be formed by different processes.

Figure 6:
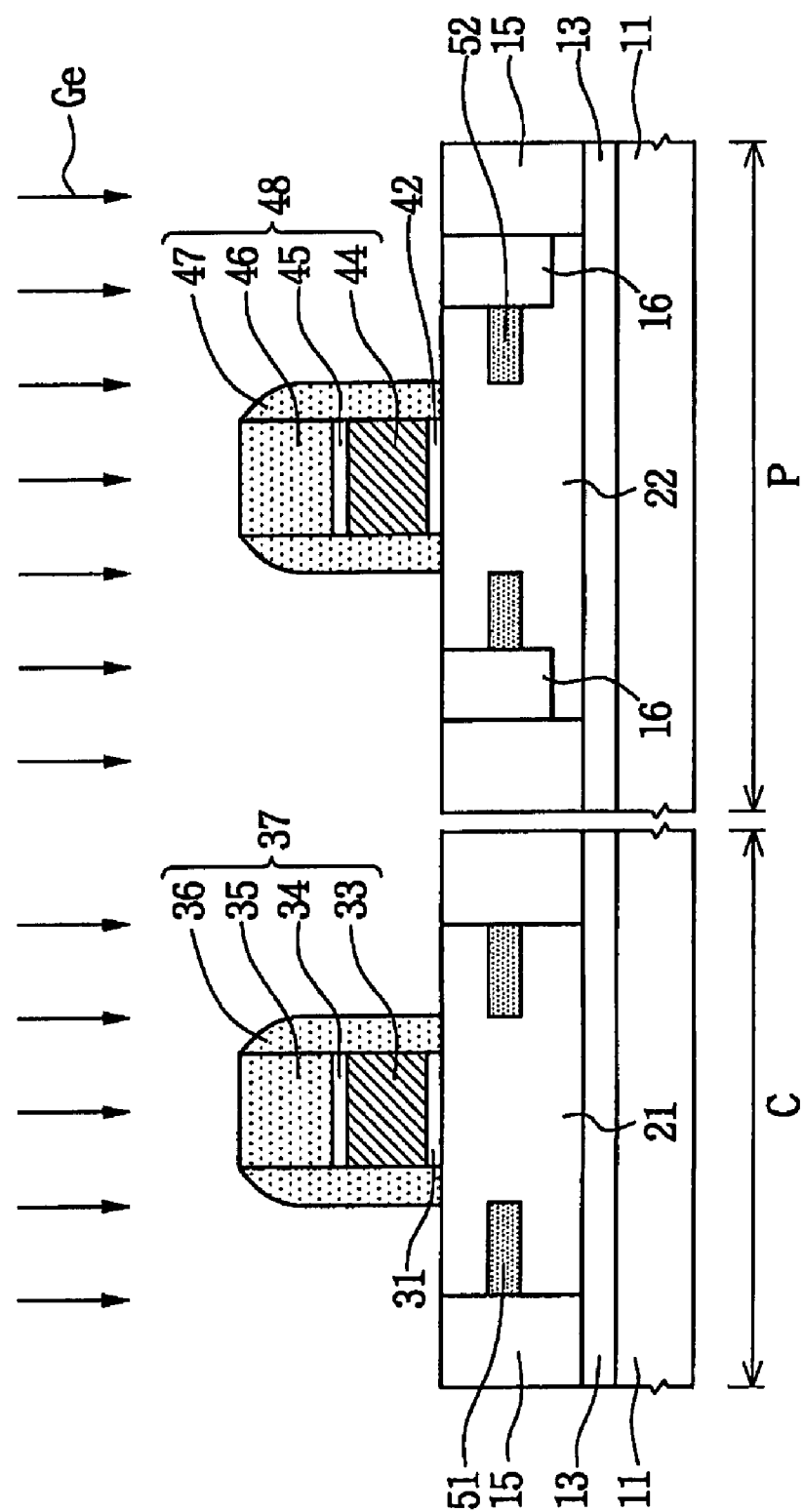

Referring to FIG. 6, first and second temporary patterns 52 and 51 may be formed by injecting germanium (Ge) ions, for example, into the floating bodies 22 and 21, respectively, using the peripheral gate pattern 48 and the cell gate pattern 37 as ion injection masks. In this case, the first and second temporary patterns 52 and 51 are positioned outside the gate patterns 48 and 37. Also, the first and second temporary patterns 52 and 51 may be formed to a predetermined depth in the floating bodies 21 and 22. The injection of the Ge ions may be performed using various ion injection energies and angles.

The first temporary patterns 52 may be formed at a higher level than a bottom surface of the first isolation layer 15. Also, the first temporary patterns 52 may be formed at a higher level than a bottom surface of the second isolation layer 16. As a result, one sidewall of each of the first temporary patterns 52 may be in contact with the second isolation layer 16. Also, the other sidewall, and top and bottom surfaces of each of the first temporary patterns 52 may be in contact with the first floating body 22.

The second temporary patterns 51 may be formed at a higher level than a bottom surface of the first isolation layer 15. One sidewall of each of the second temporary patterns 51 may be in contact with the first isolation layer 15. Also, the other sidewall, and top and bottom surfaces of each of the second temporary patterns 51 may be in contact with the second floating body 21.

Figure 7:
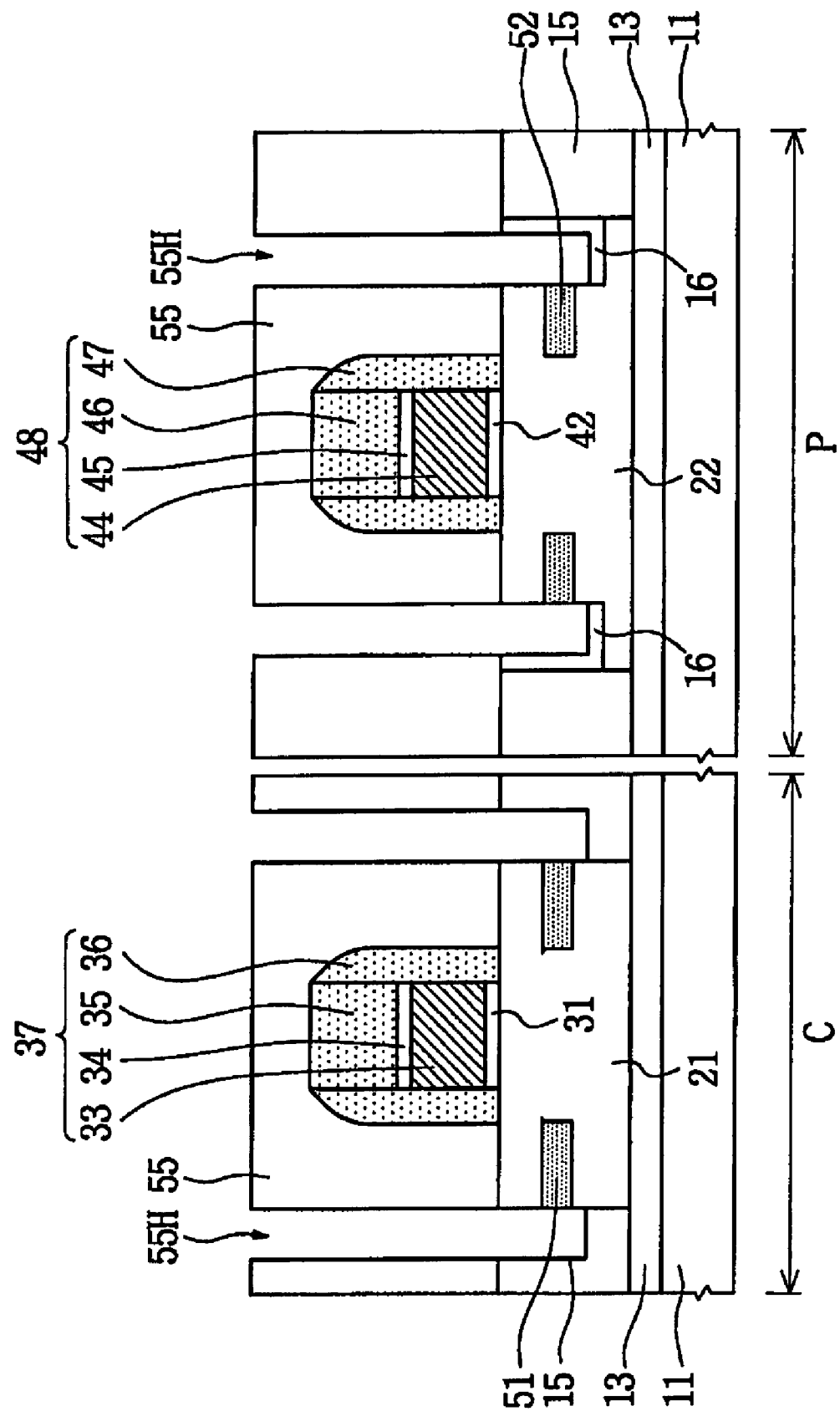

Referring to FIG. 7, a mask pattern 55 partially exposing the first isolation layer 15 and the second isolation layer 16 may be formed on the semiconductor substrate 11. The first and second isolation layers 15 and 16 may be partially etched using the mask pattern 55 as an etch mask, thereby forming openings 55H exposing the sidewalls of the first and second temporary patterns 52 and 51.

Figure 8:
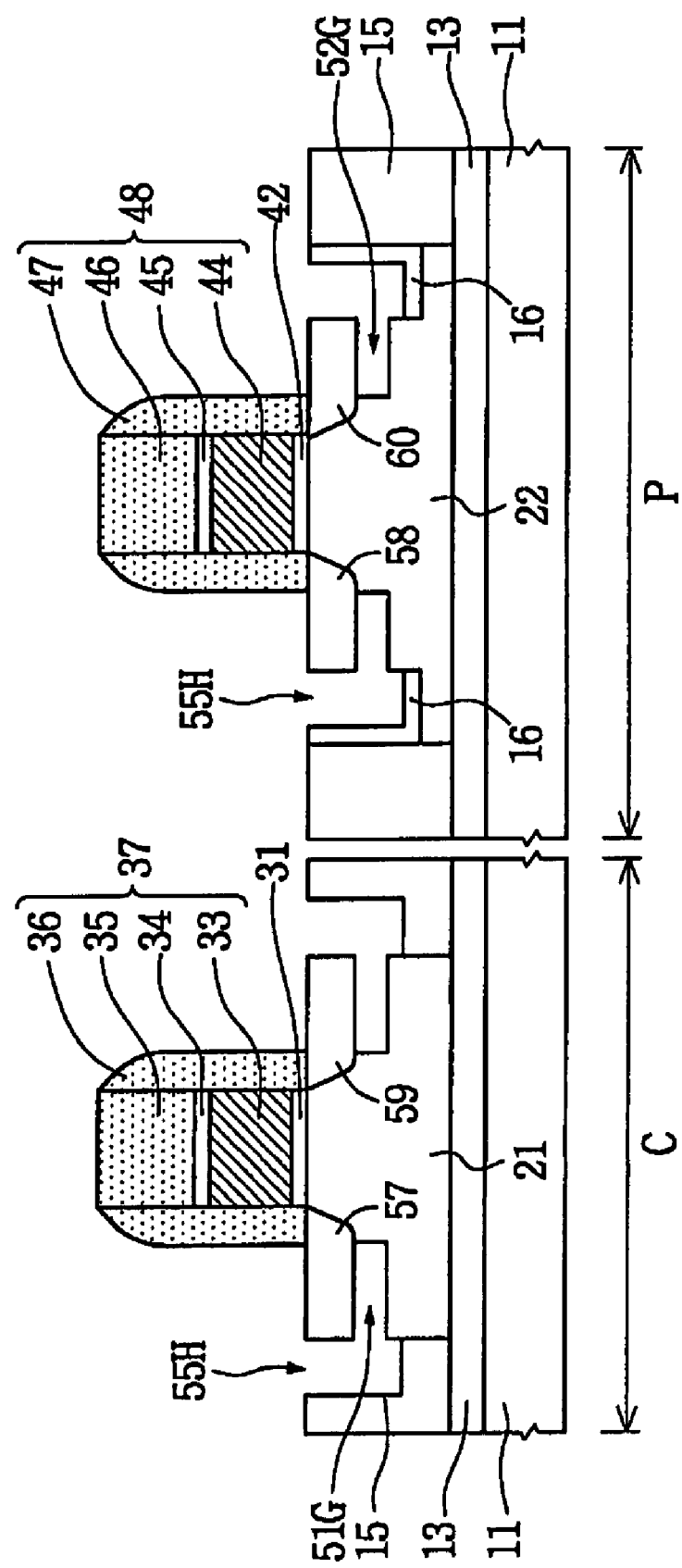

Referring to FIG. 8, etching the first and second temporary patterns 52 and 51 forms first and second gaps 52G and 51G. The gaps 52G and 51G may be formed by an isotropic etching process, for example, with an etch selectivity between the temporary patterns 52 and 51 and the floating bodies 22 and 21.

As described above, the temporary patterns 52 and 51 may maintain the state into which the Ge ions are injected. In this case, the single crystal silicon layer into which the Ge ions are injected may exhibit at least a hundred times higher etch rate than the floating bodies 22 and 21.

Subsequently, the mask pattern 55 may be removed. In an embodiment, the mask pattern 55 may be removed before etching the first and second temporary patterns 52 and 51.

First source and drain regions 58 and 60 may be formed by injecting Impurity ions into the first floating body 22 at the first gaps 52G using the peripheral gate pattern 48 as an ion injection mask. The first source and drain regions 58 and 60 may be formed by injecting impurity ions having a different conductivity type from the first floating body 22.

Also, second source and drain regions 57 and 59 may be formed by injecting impurity ions into the second floating body 21 at the second gap 51G using the cell gate pattern 37 as an ion injection mask. The second source and drain regions 57 and 59 may be formed by injecting impurity ions having a different conductivity type from the second floating body 21.

Figure 9:
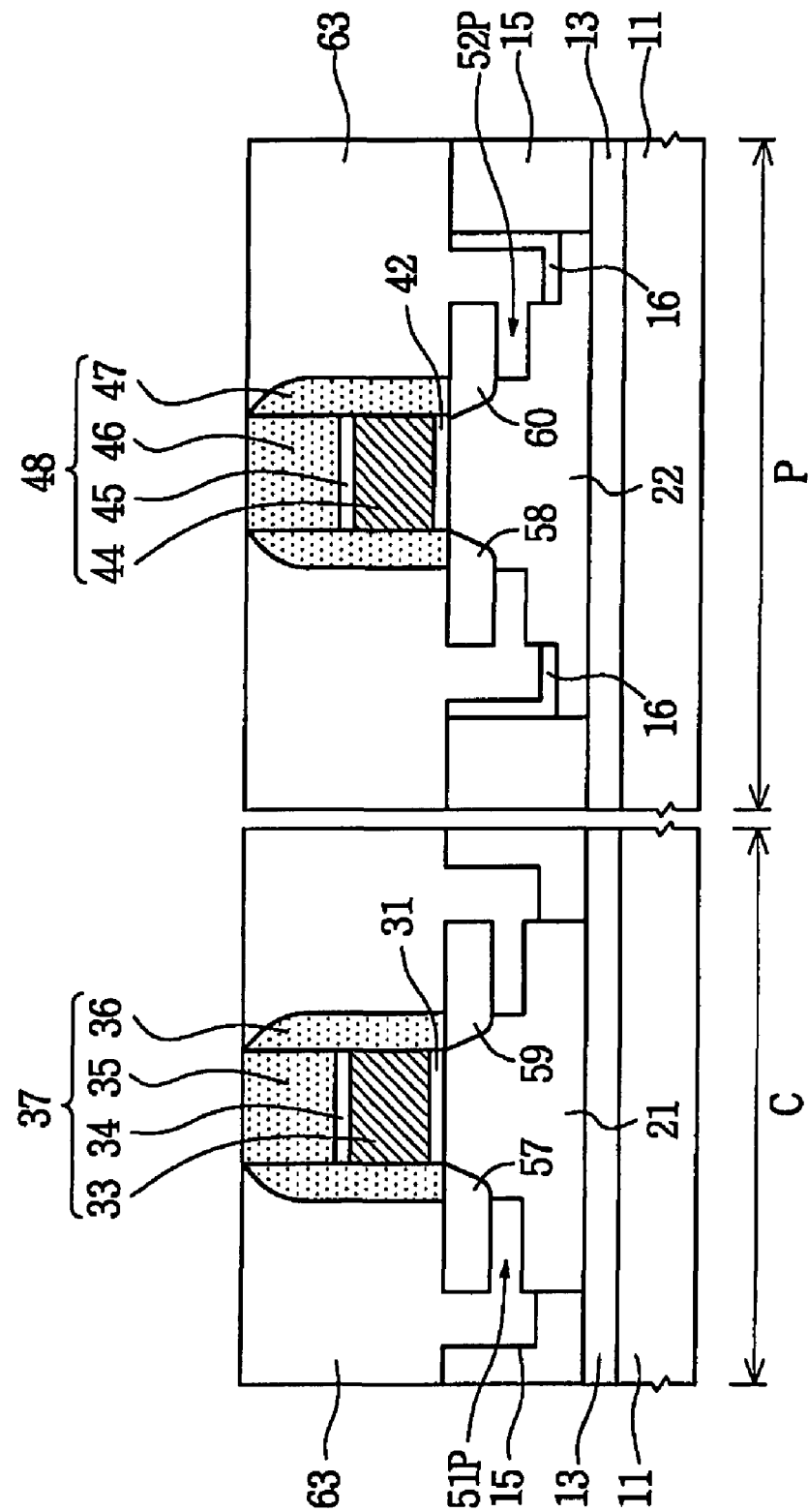

Referring to FIG. 9, a lower insulating layer 63 may be formed on the semiconductor substrate 11, including the gaps 52G and 51G. The lower insulating layer 63 may be formed, for example, from a silicon oxide layer, a silicon nitride layer, a silicon oxynitride layer, or a combination thereof. The lower insulating layer 63 may be planarized, thereby exposing the first and second mask nitride layers 46 and 35.

The lower insulating layer 63 may fill the openings 55H and the gaps 52G and 51G. The lower insulating layer 63 filling the first gaps 52G functions as first leakage shielding patterns 52P. The lower insulating layer 63 filling the second gaps 51G functions as second leakage shielding patterns 51P.

Referring back to FIG. 1, an upper insulating layer 73 covering the entire surface of the semiconductor substrate 11 is formed. The upper insulating layer 73 may be formed, for example, from a silicon oxide layer, a silicon nitride layer, a silicon oxynitride layer, or a combination thereof. The lower and upper insulating layers 63 and 73 may constitute an interlayer insulating layer.

Subsequently, source and drain plugs 76, 78, 86 and 88, a back bias plug 84, and a back gate plug 74 may be formed by semiconductor manufacturing processes, such as patterning and deposition processes. The source and drain plugs 76, 78, 86 and 88 may be formed to pass through the interlayer insulating layer to be in contact with the source and drain regions 57, 59, 58 and 60, respectively. The back bias plug 84 may be formed to pass through the interlayer insulating layer and the second isolation layer 16 to be in contact with the first floating body 22. The back gate plug 74 may be formed to pass through the interlayer insulating layer, the first isolation layer 15, and the buried insulating layer 13 to be in contact with the semiconductor substrate 11.

Source and drain lines 77, 79, 87 and 89, a back bias line 85, and a back gate line 75 may be formed on the upper insulating layer 73. The source and drain lines 77, 79, 87 and 89 may be formed in contact with the source and drain plugs 76, 78, 86 and 88. The back bias line 85 may be formed in contact with the back bias plug 84. The back gate line 75 may be formed in contact with the back gate plug 74.

The source and drain plugs 76, 78, 86 and 88, the back bias plug 84, the back gate plug 74, the source and drain lines 77, 79 and 87 and 89, the back bias line 85, and the back gate line 75 may be formed from a conductive layer, such as a polysilicon layer, a metal layer, a metal silicide layer, or a combination thereof.

The source and drain lines 77, 79 and 87 and 89 may be electrically connected to the source and drain regions 57, 59, 58 and 60, respectively, by the source and drain plugs 76, 78, 86 and 88, which pass through the interlayer insulating layer. The back bias line 85 may be electrically connected to the first floating body 22 by the back bias plug 84, which passes through the interlayer insulating layer and the second isolation layer 16. The back gate line 75 may be electrically connected to the semiconductor substrate 11 by the back gate plug 74, which passes though the interlayer insulating layer, the first isolation layer 15, and the buried insulating layer 13.

FIGS. 10 to 14 are cross-sectional views illustrating a method of fabricating a floating body memory according to a second exemplary embodiment of the present invention.

Figure 10:
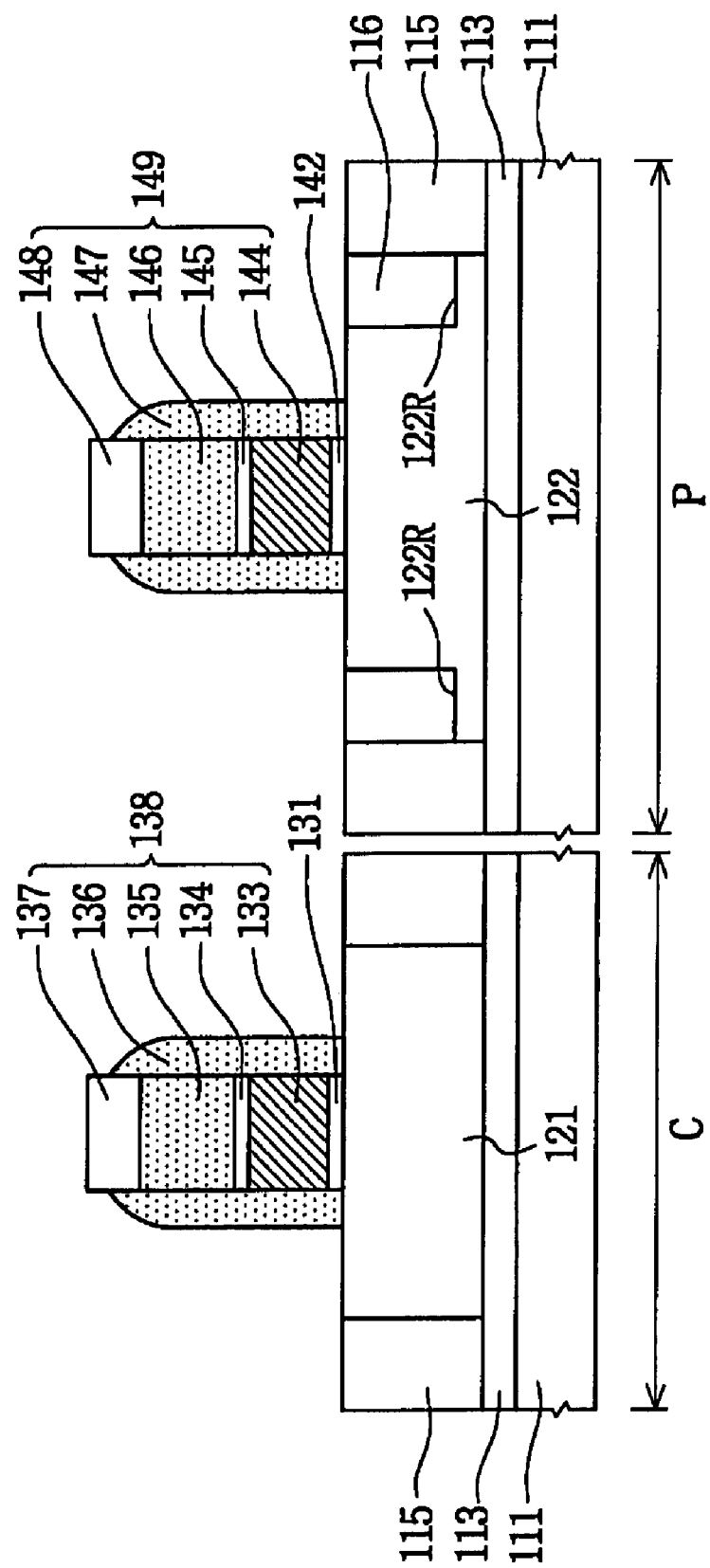
FIGS. 10 to 14 are cross-sectional views illustrating a method of fabricating a floating body memory, according to a second exemplary embodiment of the present invention.

Referring to FIG. 10, the fabrication method of the floating body memory according to the second exemplary embodiment of the present invention may include forming a buried insulating layer 113, first and second floating bodies 122 and 121, a first isolation layer 115, recessed regions 122R, and a second isolation layer 116 on a semiconductor substrate 111 having a cell region C and a peripheral circuit region P, as described with reference to FIGS. 3 and 4. Therefore, only differences between the embodiments will be described below.

A peripheral gate dielectric layer 142 may be formed on the first floating body 122. Also, a cell gate dielectric layer 131 may be formed on the second floating body 121.

A first gate electrode 144, a first pad oxide layer 145, a first mask nitride layer 146, and a first mask oxide layer 148 may be sequentially stacked on the peripheral dielectric layer 142 by deposition and patterning processes, for example. In an embodiment, the first pad oxide layer 145 may be omitted. During the patterning process for forming the first gate electrode 144, at least a portion of the peripheral gate dielectric layer 142, which extends beyond both sides of the first gate electrode 144, may be removed. In this case, a portion of the peripheral gate dielectric layer 142 remains under the first gate electrode 144.

First spacers 147 covering sidewalls of the peripheral gate dielectric layer 142, the first gate electrode 144, the first pad oxide layer 145, the first mask nitride layer 146, and the first mask oxide layer 148 may be formed. The first gate electrode 144, the first pad oxide layer 145, the first mask nitride layer 146, the first mask oxide layer 148, and the first spacers 147 may constitute a peripheral gate pattern 149. Thus, portions of the top surface of the first floating body 122, which extend beyond both sides of the peripheral gate pattern 149, may be exposed.

A second gate electrode 133, a second pad oxide layer 134, a second mask nitride layer 135, and a second mask oxide layer 137 may be formed on the cell gate dielectric layer 131. In an embodiment, the second pad oxide layer 134 may be omitted. During the patterning process for forming the second gate electrode 133, portions of the cell gate dielectric layer 131 which extend beyond both sides of the second gate electrode 133 may be removed. In this case, a portion of the cell gate dielectric layer 131 remains under the second gate electrode 133.

Second spacers 136 covering sidewalls of the cell gate dielectric layer 131, the second gate electrode 133, the second pad oxide layer 134, the second mask nitride layer 135, and the second mask oxide layer 137 may be formed. The second gate electrode 133, the second pad oxide layer 134, the second mask nitride layer 135, the second mask oxide layer 137, and the second spacers 136 may constitute a cell gate pattern 138. As a result, portions of the top surface of the second floating body 121, which extend beyond both sides of the cell gate pattern 138, may be exposed.

The first mask oxide layer 148 and the second mask oxide layer 137 may be formed from a silicon oxide layer, for example. Also, the first gate electrode 144 and the second gate electrode 133 may be formed by different processes.

Figure 11:
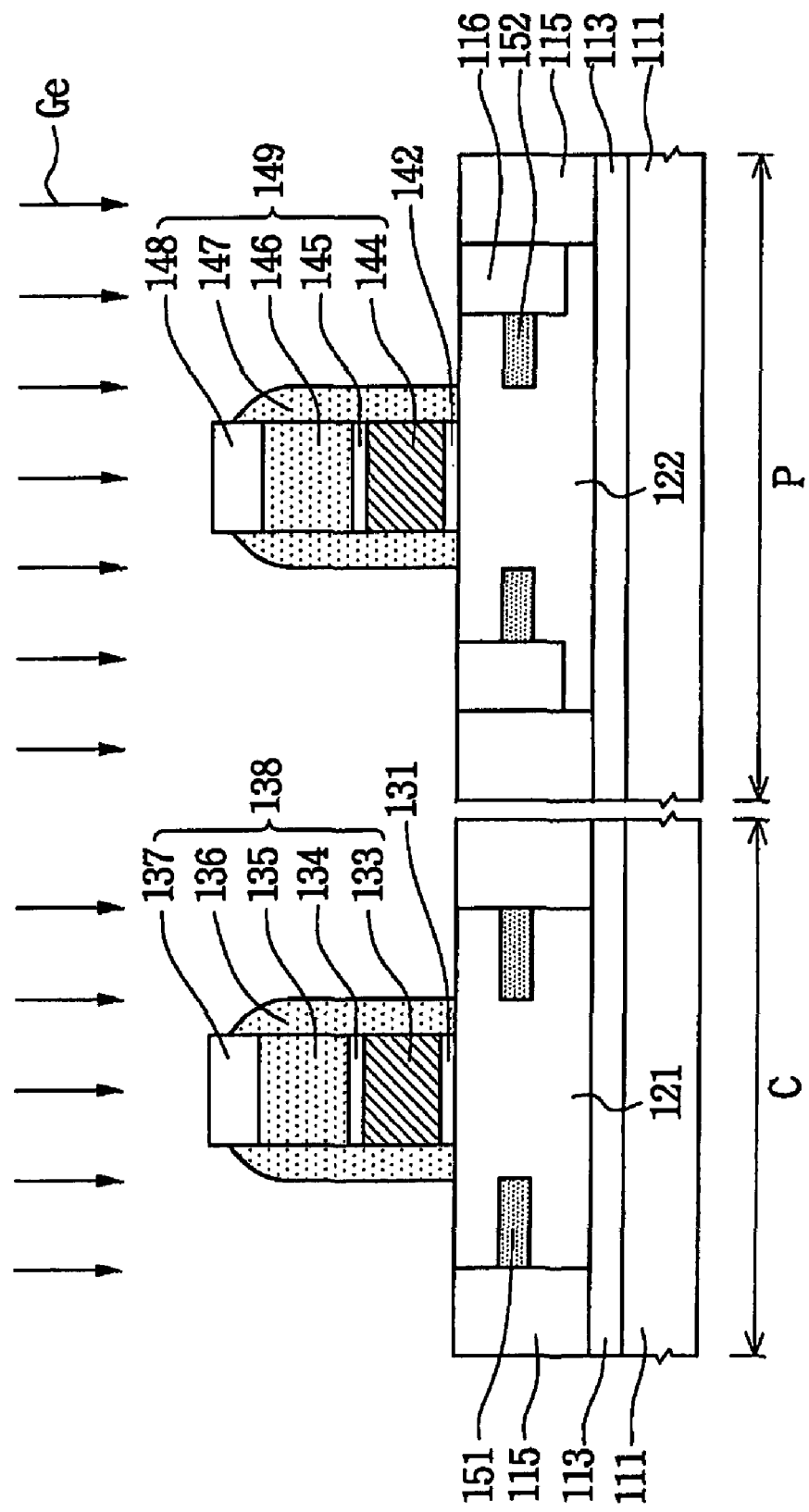

Referring to FIG. 11, first and second temporary patterns 152 and 151 may be formed, for example, by injecting Ge ions into the floating bodies 122 and 121, respectively, using the peripheral gate pattern 149 and the cell gate pattern 138 as ion injection masks. In this case, the first and second temporary patterns 152 and 151 may be positioned outside the gate patterns 149 and 138. Also, the first and second temporary patterns 152 and 151 may be formed to a predetermined depth in the floating bodies 121 and 122. The injection of the Ge ions may be performed using various ion injection energies and angles.

Figure 12:
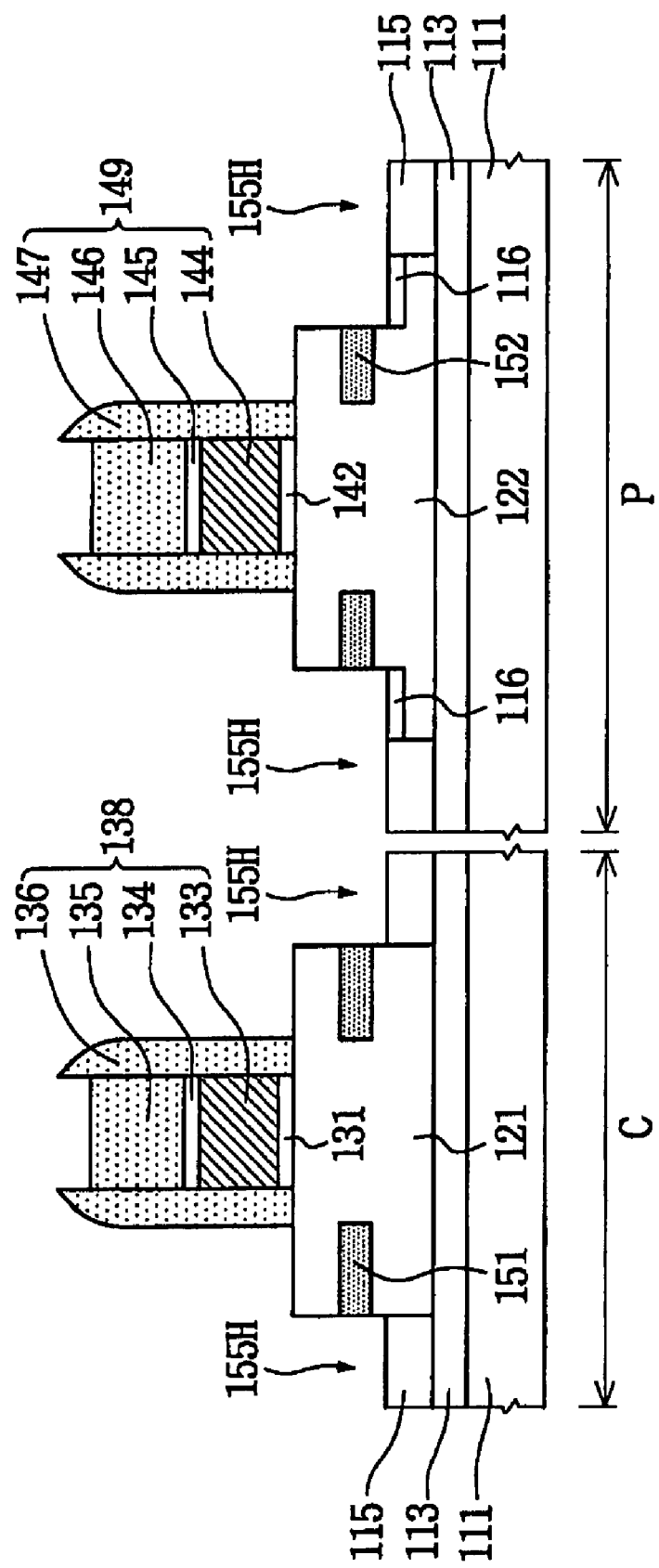

Referring to FIG. 12, the first and second isolation layers 115 and 116 are etched, thereby forming openings 155H which expose sidewalls of the first and second temporary patterns 152 and 151. Etching the first and second isolation layers 115 and 116 may be performed by an anisotropic etching process.

As a result, the first and second isolation layers 115 and 116 remain at a lower level than the first and second temporary patterns 152 and 151. While etching the first and second isolation layers 115 and 116, the first and second mask oxide layers 148 and 137 may also be etched, thereby exposing the first and second mask nitride layers 146 and 135. Alternatively, the first and second isolation layers 115 and 116 may be completely removed.

Figure 13:
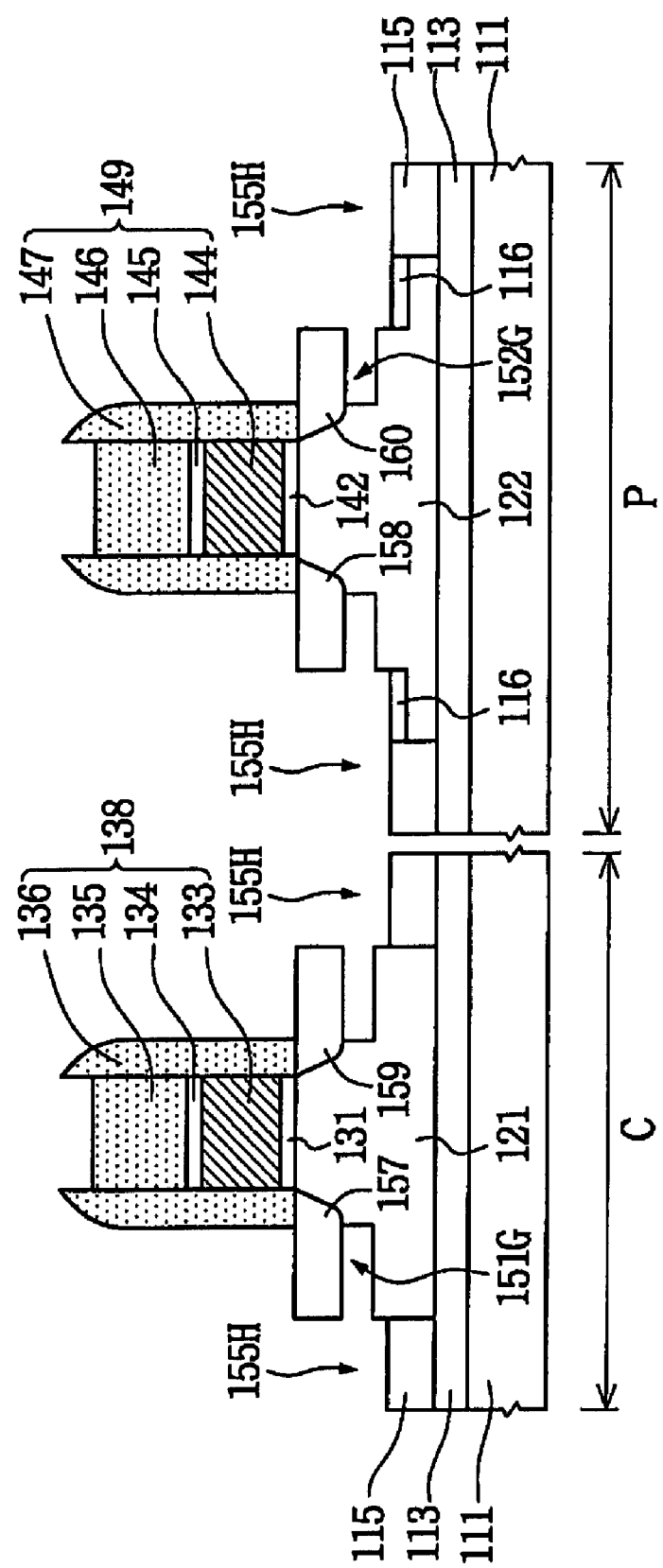

Referring to FIG. 13, the first and second temporary patterns 152 and 151 are etched, thereby forming first and second gaps 152G and 151G. The gaps 152G and 151G may be formed by an isotropic etching process with an etch selectivity between the temporary patterns 152 and 151 and the floating bodies 122 and 121, respectively.

As described above, the temporary patterns 152 and 151 may maintain the state into which the Ge ions are injected. In this case, the single crystal silicon layer into which the Ge ions are injected may exhibit at least a hundred times higher etch rate than the floating bodies 122 and 121.

Subsequently, first source and drain regions 158 and 160 may be formed by injecting impurity ions into the first floating body 122 at the first gaps 152G, using the peripheral gate pattern 149 as an ion injection mask. The first source and drain regions 158 and 160 may be formed by injecting impurity ions having a different conductivity type from the first floating body 122.

Also, second source and drain regions 157 and 159 may be formed by injecting impurity ions into the second floating body 121 at the second gaps 151G, using the cell gate pattern 138 as an ion injection mask. The second source and drain regions 157 and 159 may be formed by injecting impurity ions having a different conductivity type from the second floating body 121.

Figure 14:
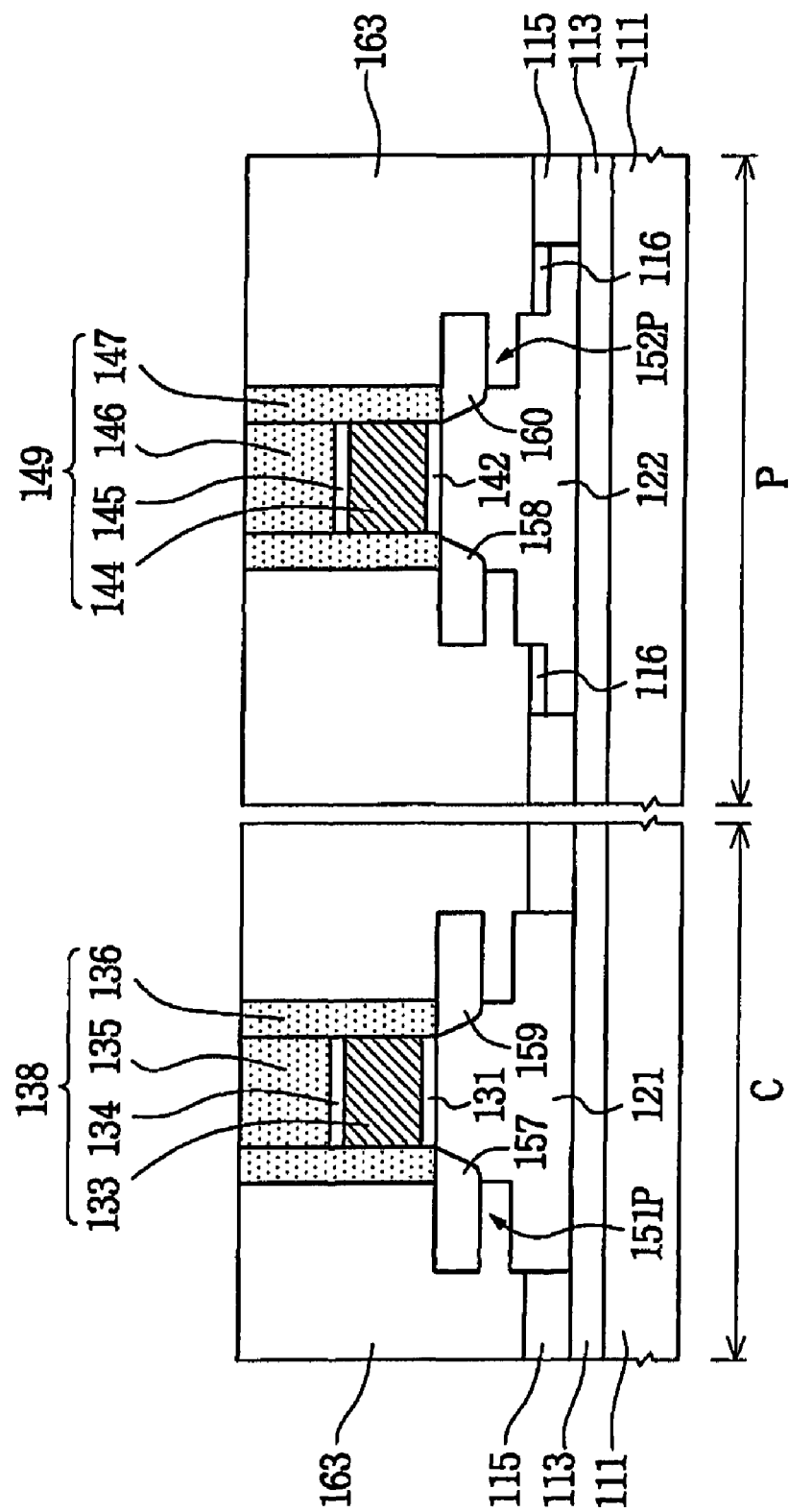

Referring to FIG. 14, a lower insulating layer 163 may be formed on the semiconductor substrate 111, including the gaps 152G and 151G. The lower insulating layer 163 is planarized, and thus the first and second mask nitride layers 146 and 135 may be exposed.

The lower insulating layer 163 may fill the openings 155H and the gaps 152G and 151G. The lower insulating layer 163 filling the first gaps 152G functions as first leakage shielding patterns 152P. The lower insulating layer 163 filling the second gaps 151G functions as second leakage shielding patterns 151P.

Referring back to FIG. 2, an upper insulating layer 173 covering the entire surface of the semiconductor substrate 111 is formed. The lower insulating layer 163 and the upper insulating layer 173 may constitute an interlayer insulating layer.

Then, source and drain plugs 176, 178, 186 and 188, a back bias plug 184, and a back gate plug 174 may be formed by semiconductor manufacturing processes, such as patterning and deposition processes. The source and drain plugs 176, 178, 186 and 188 may be formed to pass through the interlayer insulating layer to be in contact with the source and drain regions 157, 159, 158 and 160, respectively. The back bias plug 184 may be formed to pass through the interlayer insulating layer and the second isolation layer 116 to be in contact with the first floating body 122. The back gate plug 174 may be formed to pass through the interlayer insulating layer, the first isolation layer 115, and the buried insulating layer 113 to be in contact with the semiconductor substrate 111.

Source and drain lines 177, 179, 187 and 189, a back bias line 185, and a back gate line 175 may be formed on the upper insulating layer 173. The source and drain lines 177, 179, 187 and 189 may be formed in contact with the source and drain plugs 176, 178, 186 and 188, respectively. The back bias line 185 may be formed in contact with the back bias plug 184. The back gate line 175 may be formed in contact with the back gate plug 174.

The source and drain lines 177, 179, 187 and 189 may be electrically connected to the source and drain regions 157, 159, 158 and 160 by the source and drain plugs 176, 178, 186 and 188, respectively, which pass through the interlayer insulating layer. The back bias line 185 may be electrically connected to the first floating body 122 by the back bias plug 184, which passes through the interlayer insulating layer and the second isolation layer 116. The back gate line 175 may be electrically connected to the semiconductor substrate 111 by the back gate plug 174, which passes through the interlayer insulating layer, the first isolation layer 115, and the buried insulating layer 113.

As described above, according to embodiments the present invention, leakage shielding patterns are provided between source and drain regions, and a floating body. The leakage shielding patterns positioned in a peripheral circuit region of a semiconductor substrate reduce a junction capacitance between the source and drain regions, and the floating body. Also, an excess carrier storage region is provided in the floating body, which is positioned in a cell region of the semiconductor substrate. Excess holes are accumulated in the excess carrier storage region by a write operation. The leakage shielding patterns can block a leakage path of the excess holes.

As a result, a floating body memory, including a peripheral transistor with a high-speed operation characteristic and a memory cell with an excellent data retention characteristic, can be realized.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A floating body memory, comprising:
 a semiconductor substrate comprising a cell region and a peripheral circuit region;
 a floating body cell located in the cell region of the semiconductor substrate;
 a first floating body located in the peripheral circuit region of the semiconductor substrate;
 a peripheral gate pattern positioned on the first floating body;
 first source and drain regions positioned at both sides of the peripheral gate pattern; and
 first leakage shielding patterns positioned between the first floating body and the first source and drain regions, the first source and drain regions contacting the first floating body,
 wherein the first leakage shielding patterns contact bottom surfaces of the first source and drain regions,
 wherein the first floating body is interposed between the first source and drain regions, and extends under the first leakage shielding patterns,
 wherein the first floating body extends beyond the first source and drain regions and the first leakage shielding patterns, and
 wherein the floating body memory further comprises a back bias line positioned on the semiconductor substrate, and a back bias plug positioned between the extended first floating body and the back bias line and in contact with the extended first floating body and the back bias line.

2. The floating body memory according to claim 1, wherein the first leakage shielding patterns are positioned outside outer edges of the peripheral gate pattern.

3. The floating body memory according to claim 1, further comprising:
a first isolation layer defining the first floating body; and
a second isolation layer on the extended first floating body.

4. The floating body memory according to claim 1, wherein the first leakage shielding patterns comprise at least one of a silicon oxide layer, a silicon nitride layer and a silicon oxynitride layer.

5. A floating body memory, comprising:
a semiconductor substrate comprising a cell region and a peripheral circuit region;
a floating body cell located in the cell region of the semiconductor substrate;
a first floating body located in the peripheral circuit region of the semiconductor substrate;
a peripheral gate pattern positioned on the first floating body;
first source and drain regions positioned at both sides of the peripheral gate pattern; and
first leakage shielding patterns positioned between the first floating body and the first source and drain regions, the first source and drain regions contacting the first floating body,
wherein the floating body cell comprises:
a second floating body located in the cell region of the semiconductor substrate, the second floating body comprising an excess carrier storage region;
a cell gate pattern positioned on the second floating body;
second source and drain regions positioned at both sides of the cell gate pattern; and
second leakage shielding patterns positioned between the second floating body and the second source and drain regions, the second source and drain regions contacting the second floating body.

6. The floating body memory according to claim 5, wherein the second leakage shielding patterns contact bottom surfaces of the second source and drain regions.

7. The floating body memory according to claim 6, wherein the second floating body is interposed between the second source and drain regions, and extends under the second leakage shielding patterns.

8. The floating body memory according to claim 7, wherein a width of the excess carrier storage region is greater than a width of the cell gate pattern.

9. The floating body memory according to claim 5, further comprising:
a buried insulating layer positioned under the first and second floating bodies and covering the semiconductor substrate.

10. The floating body memory according to claim 9, further comprising:
a back gate line positioned on an insulting layer; and
a back gate plug passing through at least the buried insulating layer and contacting the back gate line and the semiconductor substrate in the cell region.

11. A method of fabricating a floating body memory, comprising:
forming a first isolation layer defining first and second floating bodies on a semiconductor substrate, the first floating body being formed in a peripheral circuit region of the semiconductor substrate and the second floating body being formed in a cell region of the semiconductor substrate;
forming a recessed region at an edge of the first floating body;
forming a second isolation layer filling the recessed region;
forming a peripheral gate pattern on the first floating body, and a cell gate pattern on the second floating body; and
forming first leakage shielding patterns in the first floating body at both sides of the peripheral gate pattern, and second leakage shielding patterns in the second floating body at both sides of the cell gate pattern.

12. The method according to claim 11, wherein forming the first leakage shielding pattern and the second leakage shielding pattern comprises:
injecting germanium (Ge) ions into the first floating body and the second floating body using the peripheral gate pattern and the cell gate pattern as masks, respectively, and forming first and second temporary patterns;
etching the first and second temporary patterns, and forming first and second gaps; and
filling the first and second gaps with an insulating layer.

13. The method according to claim 12, further comprising:
forming first and second source and drain regions in the first and second floating bodies over the first and second gaps, respectively.

14. The method according to claim 11, further comprising:
forming first and second source and drain regions over the first and second leakage shielding patterns, respectively.

15. The method according to claim 11, wherein the first floating body extends beyond the first leakage shielding patterns.

16. The method according to claim 11, wherein each of the first and second leakage shielding patterns is formed from at least one of a silicon oxide layer, a silicon nitride layer and a silicon oxynitride layer.

17. The method according to claim 11, further comprising:
forming a gate dielectric layer on the first floating body and the second floating body before forming the peripheral gate pattern on the first floating body and the cell gate pattern on the second floating body.

18. The method according to claim 11, wherein forming each of the peripheral gate pattern and the cell gate pattern comprises:
sequentially stacking a gate electrode, a pad oxide layer and a mask nitride layer.

19. The method according to claim 11, further comprising:
forming an interlayer insulating layer covering the peripheral gate pattern, the cell gate pattern, the first floating body and the second floating body;
forming a back bias plug passing through at least the interlayer insulating layer and the second isolation layer to contact the first floating body, and a back gate plug passing through at least the interlayer insulating layer and the first isolation layer to contact the semiconductor substrate in the cell region; and
forming a back bias line on the interlayer insulating layer in contact with the back bias plug and forming a back gate line on the interlayer insulating layer in contact with the back gate plug.

* * * * *